US010787392B2

(12) United States Patent
Miyamoto et al.

(10) Patent No.: US 10,787,392 B2
(45) Date of Patent: Sep. 29, 2020

(54) ALUMINUM NITRIDE SINTERED COMPACT AND METHOD FOR PRODUCING SAME

(71) Applicant: SHOWA DENKO K.K., Tokyo (JP)

(72) Inventors: Daisuke Miyamoto, Shiojiri (JP); Kosuke Shioi, Tochigi (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/631,046

(22) PCT Filed: Jul. 19, 2018

(86) PCT No.: PCT/JP2018/027008
§ 371 (c)(1),
(2) Date: Jan. 14, 2020

(87) PCT Pub. No.: WO2019/021919
PCT Pub. Date: Jan. 31, 2019

(65) Prior Publication Data
US 2020/0148598 A1 May 14, 2020

(30) Foreign Application Priority Data

Jul. 24, 2017 (JP) ................. 2017-142978

(51) Int. Cl.
C04B 35/581 (2006.01)
C04B 35/64 (2006.01)
(Continued)

(52) U.S. Cl.
CPC ........ C04B 35/581 (2013.01); C04B 35/6264 (2013.01); C04B 35/6303 (2013.01);
(Continued)

(58) Field of Classification Search
CPC .................................................. C04B 35/581
See application file for complete search history.

(56) References Cited

U.S. PATENT DOCUMENTS 6,271,163 B1 * 8/2001 Yushio .................. C04B 35/581
257/E23.009
2002/0165079 A1 11/2002 Katsuda et al.
2006/0154827 A1 7/2006 Kanechika et al.

FOREIGN PATENT DOCUMENTS

JP 01-103961 A 4/1989
JP 03-045562 A 2/1991
(Continued)

OTHER PUBLICATIONS

Kazuo Shinozaki, et al., Ceramics Japan, 1986, pp. 1130-1135, 21.
(Continued)

Primary Examiner — Karl E Group
(74) Attorney, Agent, or Firm — Sughrue Mion, PLLC

(57) ABSTRACT

An aluminum nitride sintered compact containing aluminum nitride crystal grains and composite oxide crystal grains containing a rare earth element and an aluminum element, wherein a median diameter of the aluminum nitride crystal grains is 2 μm or less; 10 to 200 intergrain voids having a longest diameter of 0.2 to 1 μm are dispersed in a region of a cross section of 100 μm in square; and the carbon atom content is less than 0.10% by mass. Also disclosed is a method of producing the aluminum nitride sintered compact.

12 Claims, 1 Drawing Sheet

(51) Int. Cl.
  *H01L 23/15*   (2006.01)
  *H01L 23/373*  (2006.01)
  *C04B 35/626*  (2006.01)
  *C04B 35/63*   (2006.01)
  *C04B 35/634*  (2006.01)
  *C04B 35/638*  (2006.01)
  *H01L 21/48*   (2006.01)

(52) U.S. Cl.
  CPC ........ *C04B 35/638* (2013.01); *C04B 35/6342* (2013.01); *C04B 35/64* (2013.01); *H01L 21/4807* (2013.01); *H01L 23/15* (2013.01); *H01L 23/3731* (2013.01); *C04B 2235/3217* (2013.01); *C04B 2235/3225* (2013.01); *C04B 2235/3865* (2013.01); *C04B 2235/6025* (2013.01); *C04B 2235/658* (2013.01); *C04B 2235/6567* (2013.01); *C04B 2235/786* (2013.01); *C04B 2235/85* (2013.01)

(56) References Cited

FOREIGN PATENT DOCUMENTS

| JP | 05-238830 A | 9/1993 |
| JP | 06-191953 A | 7/1994 |
| JP | 2002-249379 A | 9/2002 |
| JP | 2007-008813 A | 1/2007 |

OTHER PUBLICATIONS

Glen A. Slack, et al., "The Instrinsic Thermal Conductivity of Ain", J. Phys. Chem. Solids, 1987, pp. 641-647, vol. 48.

Masahide Okamoto, et al., "Effect of Microstructure on Thermal Conductivity of AlN Ceramics", Journal of the Ceramic Society of Japan, 1989, pp. 1478-1485, vol. 97.

H. P. Kirchner, et al., "Strength-Anisotropy-Grain Size Relations in Ceramic Oxides", Journal of the American Ceramic Society, May 1970, pp. 232-236, vol. 53.

International Search Report for PCT/JP2018/027008, dated Oct. 16, 2018 {PCT/ISA/210].

International Preliminary Report on Patentability with Written Opinion of the International Searching Authority for PCT/JP018/027008 dated Jan. 28, 2020 (8 pages).

* cited by examiner

[Fig. 1]
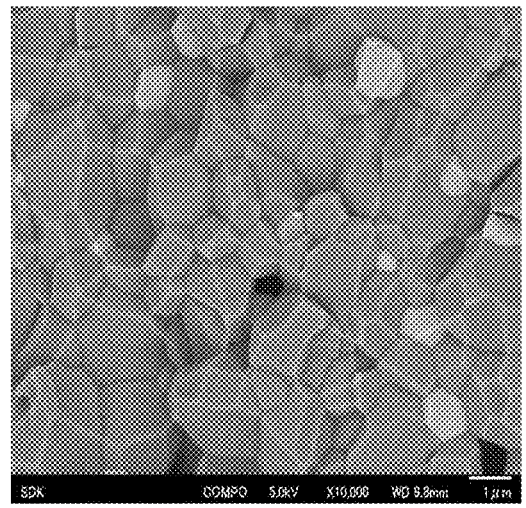
[Fig. 2]
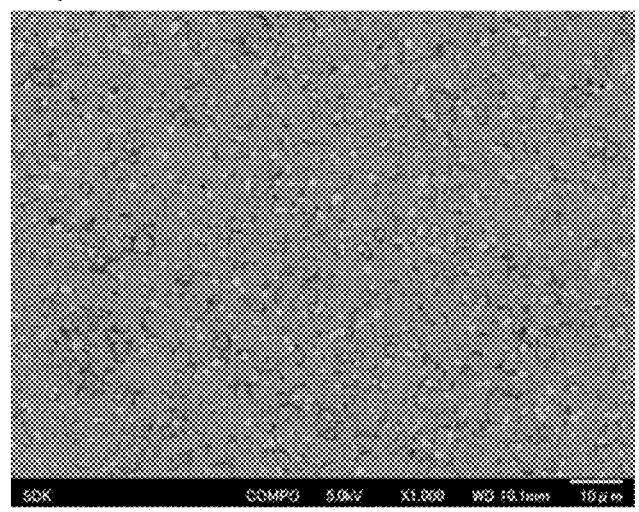
[Fig. 3]
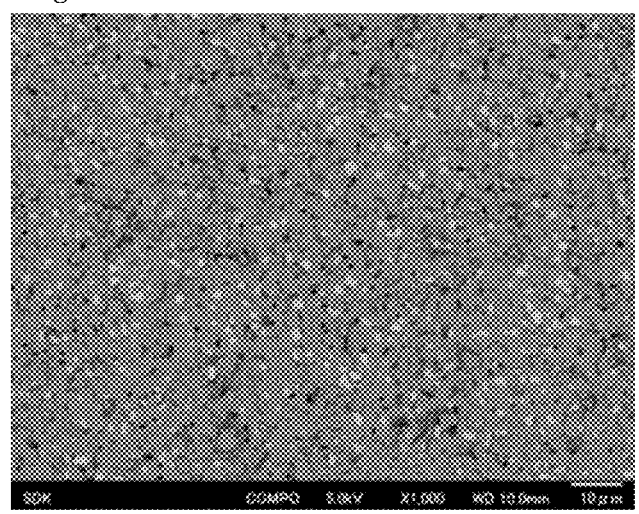

ALUMINUM NITRIDE SINTERED COMPACT AND METHOD FOR PRODUCING SAME

CROSS REFERENCE TO RELATED APPLICATIONS

This application is a National Stage of International Application No. PCT/JP2018/027008 filed Jul. 19, 2018, claiming priority based on Japanese Patent Application No. 2017-142978 filed Jul. 24, 2017.

TECHNICAL FIELD

The present invention relates to an aluminum nitride sintered compact and a method of producing the same.

BACKGROUND ART

In recent years, downsizing of a circuit board and attainment of a high output power of a power module are being advanced. As the circuit board to be used for a power module or the like, those in which a metal circuit layer is joined on the surface of a ceramic sintered compact with a solder, and a semiconductor device is mounted in a predetermined position of the metal circuit layer are widely used.

In order that the power module may work with high reliability, a circuit board that is excellent in heat dissipation and mechanical strength is demanded. So far as the heat dissipation is good, heat which the circuit generates is efficiently released, and overheating of the semiconductor device is suppressed. So far as the mechanical strength is excellent, the circuit board is also able to endure a thermal stress to be caused due to a difference in a thermal expansion coefficient from the metal circuit layer. As the circuit board responding to such requirements, a ceramic insulating substrate using an aluminum nitride (hereinafter occasionally referred to as "AlN") sintered compact having high electric insulation and high thermal conductivity is watched.

Since AlN is a material that is highly covalent and hardly sinterable, in order to obtain a minute AlN sintered compact, addition of a sintering aid, such as yttrium oxide ($Y_2O_3$), is needed. Yttrium oxide as a sintering aid reacts with impurity oxygen solid-solved on the surface or interior of an AlN crystal grain during sintering to form a Y—Al—O-based liquid phase, thereby not only trapping the impurity oxygen on the crystal boundary but also accelerating densification of the crystal (see NPL 1).

Meanwhile, when the impurity oxygen is solid-solved in the AlN crystal grain in the resulting AlN sintered compact, a lattice defect is generated in the AlN crystal grain and becomes a phonon scattering center, thereby drastically decreasing a coefficient of thermal conductivity (see NPL 2).

In addition, there is a concern that the lattice defect in the AlN crystal grain brings a decrease of mechanical strength or an increase of dielectric loss, and a reduction of the impurity oxygen in the AlN crystal grain is an important technical problem.

As a measure for reducing the impurity oxygen in the AlN crystal grain, for example, it may be considered to use an AlN powder having a small amount of the impurity oxygen as a raw material. But, in general, a raw material having a small amount of impurities becomes a large cause of cost rise. In addition, as disclosed in NPL 3, there is a method of removing the impurity oxygen from the AlN sintered compact by performing sintering at a high temperature for a long time in a reductive atmosphere. However, according to this method, it takes a long time for sintering, and therefore, there is a concern about a decrease of productivity.

The mechanical strength of a ceramic depends upon the crystal grain diameter, and as the grain diameter increases, the mechanical strength is decreased (see NPL 4). According to the aforementioned method of performing sintering at a high temperature for a long time, the crystal grain in the AlN sintered compact is inevitably coarsened, whereby the strength is decreased. Thus, it was difficult to prepare an AlN sintered compact satisfying both the high coefficient of thermal conductivity and the high mechanical strength.

In response to the aforementioned problems, PTL 1 discloses that by adding aluminum nitride obtained by the vapor-phase chemical synthesis method, an aluminum nitride sintered compact having high thermal conductivity and simultaneously having high strength is obtained. In addition, PTL 2 discloses that by reducing the content of impurities, an aluminum nitride sintered compact having an excellent Weibull modulus is obtained.

CITATION LIST

Patent Literature

PTL 1: JP 2007-8813 A
PTL 2: JP 1-103961 A
NPL 1: SHINOZAKI Kazuo and TSUGE Akihiko, *CERAMICS JAPAN*, 21, pp. 1130-1135 (1986)
NPL 2: G. A. Slack, R. A. Tanzilli, R. O. Pohl, and J. W. Vandersande, *J. Phys. Chem. Solids*, vol. 48, pp. 641-647 (1987)
NPL 3: OKAMOTO Masahide, ARAKAWA Hideo, OOHASHI Masabumi, and OGIHARA Satoru, *Journal of the Ceramic Society of Japan*, vol. 97, pp. 1478-1485 (1989)
NPL 4: H. P. Kirchner and R. M. Gruver, *J. Am. Ceram. Soc.*, vol. 53, pp. 232-236 (1970)

SUMMARY OF INVENTION

Technical Problem

However, as for the aluminum nitride sintered compact as disclosed in PTL 1, in view of the fact that not only the cost is high, but also plural aluminum nitride powders having a greatly different grain diameter from each other are mixed, the grain size distribution within the aluminum nitride sintered compact is not uniform, and a variation in the strength within the aluminum nitride sintered compact is large. In addition, as for the aluminum nitride sintered compact as disclosed in PTL 2, though the Weibull modulus is excellent, those having a strength of more than 600 MPa are not obtained.

Solution to Problem

The present invention includes the following constitutions.
[1] An aluminum nitride sintered compact containing aluminum nitride crystal grains and composite oxide crystal grains containing a rare earth element and an aluminum element, wherein
a median diameter of the aluminum nitride crystal grains is 2 µm or less; 10 to 200 intergrain voids having a longest diameter of 0.2 to 1 µm are dispersed in a region of a cross section of 100 µm in square; and the carbon atom content is less than 0.10% by mass.

[2] The aluminum nitride sintered compact as set forth in the above item [1], wherein a median diameter of the composite oxide crystal grains is smaller than the median diameter of the aluminum nitride crystal grains.
[3] The aluminum nitride sintered compact as set forth in the above item [1] or [2], wherein the median diameter of the composite oxide crystal grains is 1.5 μm or less.
[4] The aluminum nitride sintered compact as set forth in any of the above items [1] to [3], wherein the rare earth element is one or more elements selected from the group consisting of yttrium-based and lanthanide-based rare earth elements.
[5] A method of producing an aluminum nitride sintered compact that is the aluminum nitride sintered compact as set forth in any of the above items [1] to [4], the method including a primary mixing step of mixing a raw material powder containing an aluminum nitride powder and a sintering aid with an organic solvent to obtain a raw material slurry; a secondary mixing step of mixing the raw material slurry with a binder solution to obtain a mixture, followed by filtration of the mixture to obtain a mixed slurry; a molding step of molding the mixed slurry to obtain an aluminum nitride molded compact; a degreasing step of heating the aluminum nitride molded compact to lower than 600° C. in an oxidative gas atmosphere to obtain an aluminum nitride degreased compact; and a sintering step of sintering the aluminum nitride degreased compact to obtain an aluminum nitride sintered compact.
[6] The method of producing an aluminum nitride sintered compact as set forth in the above item [5], wherein the sintering aid contains a compound having one or more elements selected from the group consisting of yttrium-based and lanthanide-based rare earth elements.
[7] The method of producing an aluminum nitride sintered compact as set forth in the above item [6], wherein the sintering aid further contains a compound having an aluminum element.
[8] The method of producing an aluminum nitride sintered compact as set forth in any of the above items [5] to [7], further including a binder solution preparation step of dissolving a binder component in an organic solvent to obtain a solution, followed by filtration of the solution to obtain the binder solution, prior to the secondary mixing step.
[9] The method of producing an aluminum nitride sintered compact as set forth in any of the above items [5] to [8], wherein the oxidative gas to be used in the degreasing step is a mixed gas containing an oxygen gas.
[10] The method of producing an aluminum nitride sintered compact as set forth in any of the above items [5] to [9], wherein the carbon atom content of the aluminum nitride degreased compact is 0.10% by mass or less.
[11] The method of producing an aluminum nitride sintered compact as set forth in any of the above items [5] to [10], wherein the sintering step includes heating in an inert gas atmosphere of 1,400° C. or higher and 1,800° C. or lower for 24 hours or less.
[12] The method of producing an aluminum nitride sintered compact as set forth in the above item [11], wherein the inert gas to be used in the sintering step is a nitrogen gas.

Advantageous Effects of Invention

In view of the fact that the aluminum nitride sintered compact of the present invention is suppressed in terms of growth of aluminum nitride crystal grains and has intergrain voids uniformly dispersed among the aluminum nitride crystal grains, not only it has a higher strength than the conventional aluminum nitride sintered compacts, but also the variation in the strength within the aluminum nitride sintered compact is small.

BRIEF DESCRIPTION OF DRAWINGS

FIG. 1 is a scanning electron microscope (SEM) image at a magnification of 10,000 times of a fracture surface of an aluminum nitride sintered compact prepared in Example 1. In the SEM image, black parts are an intergrain void. Parts that look relatively dark are an aluminum nitride crystal grain, and parts that look relatively bright are a composite oxide crystal grain.
FIG. 2 is an SEM image at a magnification of 1,000 times of a fracture surface of an aluminum nitride sintered compact prepared in Example 1.
FIG. 3 is an SEM image at a magnification of 1,000 times of a fracture surface of an aluminum nitride sintered compact prepared in Comparative Example 1.

DESCRIPTION OF EMBODIMENTS

The aluminum nitride sintered compact and the production method thereof of the present invention are hereunder described in detail.
(Aluminum Nitride Sintered Compact)
The aluminum nitride sintered compact of the present invention is one containing aluminum nitride (hereinafter also referred to as "AlN") crystal grains and composite oxide crystal grains containing a rare earth element and an aluminum element, wherein a median diameter of the aluminum nitride crystal grains is 2 μm or less; 10 to 200 intergrain voids having a longest diameter of 0.2 to 1 μm are dispersed in a region of a cross section of 100 μm in square; and the carbon atom content is less than 0.10% by mass. The AlN sintered compact is a polycrystal body containing, as a main ingredient, the AlN crystal grains and contains, as an accessory ingredient, the composite oxide crystal grains, and the intergrain voids are uniformly dispersed and exist in the AlN sintered compact without being adjacent to each other.
(AlN Crystal Grains)
In this specification, the size of the AlN crystal grains is defined in terms of a median diameter. The median diameter is a value corresponding to an accumulation of 50% of the cumulative grain size distribution on the number basis. The median diameter of the AlN crystal grains which the AlN sintered compact of the present invention contains is 2 μm or less. As the median diameter of the AlN crystal grains is smaller, the strength of the AlN sintered compact is higher, and the median diameter of the AlN crystal grains is preferably 1.7 μm or less, and more preferably 1.5 μm or less. When the median diameter of the AlN crystal grains falls within the aforementioned range, an AlN sintered compact having a sufficiently high mechanical strength is revealed.
(Median Diameter of AlN Crystal Grains)
The median diameter of the AlN crystal grains which the AlN sintered compact of the present invention contains is determined by observing a fracture surface of the AlN sintered compact with a scanning electron microscope (SEM) at a magnification of 1,000 times or more and by measuring the grain diameter of at least 500 AlN crystal grains in an arbitrary region of 100 μm in square. Since the AlN crystal grain is not perfectly spherical, the longest diameter thereof is defined as the grain diameter of the AlN crystal grain. In this specification, the longest diameter of the crystal grain means a length of a longest diagonal line which a polygon constituting the contour of the crystal grain determined in the following manner has.

When the fracture surface of the AlN sintered compact composed of a polycrystal body is subjected to SEM observation, the contour of the AlN crystal grain is observed as a convex polygon in the visual field plane. Among diagonal lines of plural lengths which the convex polygon has, the length of the longest diagonal line is defined as the longest diameter of the crystal grain. AlN crystal grains which are observed as the AlN crystal grain in the visual field of the SEM image, but in which the length of the longest diagonal line of the polygon constituting the contour of the crystal grain cannot be clearly measured due to overlapping of other AlN crystal grains or the like, are not included in the object of the measurement of the grain diameter.

For example, as shown in FIG. 1, when the AlN crystal grains and the composite oxide crystal grains are observed in the SEM image of the fracture surface of the AlN sintered compact, grains that look relatively dark are an AlN crystal grain, and grains that look relatively bright are a composite oxide crystal grain described later. Discrimination between the AlN crystal grain and the composite oxide crystal grain can also be confirmed from a difference of elements which the crystal grains contain, by using an energy dispersive X-ray spectroscopy (EDS) analyzer annexed to an SEM apparatus. This method is hereunder occasionally referred to as "SEM-EDS analysis".

(Composite Oxide Crystal Grains)

The composite oxide crystal grains which the AlN sintered compact of the present invention contains are a crystal grain of a composite oxide containing a rare earth element (hereinafter also referred to as "RE") and an aluminum element. The AlN sintered compact of the present invention contains the composite oxide crystal grains as an accessory ingredient.

As the crystal phase of the composite oxide, there is exemplified a crystal phase of a monoclinic system structure ($RE_4Al_2O_9$), an orthorhombic system perovskite structure ($REAlO_3$), or a cubic system garnet structure ($RE_3Al_5O_{12}$), wherein RE represents one or more elements selected from the group consisting of yttrium-based and lanthanide-based rare earth elements. The composite oxide crystal grain preferably contains at least one or more crystal phases of $RE_4Al_2O_9$, $REAlO_3$, and $RE_3Al_5O_{12}$ and preferably contains two crystal phases of $REAlO_3$ and $RE_3Al_5O_{12}$. However, one composed of a crystal phase of $Re_3Al_5O_{12}$ alone is not included. In addition, in view of the fact that when the AlN sintered compact contains crystal grains other than the AlN crystal grains and the composite oxide crystal grains containing a rare earth element and an aluminum element, there is a high possibility of decreasing the thermal conductivity of the AlN sintered compact, it is preferred that the crystal grains which the AlN sintered compact contains are composed of only the AlN crystal grains and the composite oxide crystal grains containing a rare earth element and an aluminum element. The crystal phase of the composite oxide can be identified by the X-ray diffraction method. Examples of the rare earth element include Y, La, Ce, Pr, Sm, Eu, Gd, Tb, Dy, Ho, Er, Tm, Yb, and Lu. Above all, in view of the fact that when the ion radius is small, the coefficient of thermal conductivity is readily increased, Y, Lu, Yb, Tm, Er, and Ho are preferred.

In the case where the crystal phase contained in the composite oxide crystal grains is composed of $YAlO_3$ (hereinafter occasionally referred to as "YAP") and $Y_3Al_5O_{12}$ (hereinafter occasionally referred to as "YAG"), when an amount ratio of $YAlO_3$ and $Y_3Al_5O_{12}$ which the composite oxide crystal grain contains is expressed in terms of a ratio $I_{YAG}/I_{YAP}$ of a diffraction peak height $I_{YAG}$ at a diffraction angle $2\theta=46.6°$ originated from a plane index (532) of $Y_3Al_5O_{12}$ to a diffraction peak height $I_{YAP}$ at a diffraction angle $2\theta=34.3°$ originated from a plane index (121) of $YAlO_3$ in the X-ray diffraction pattern, the $I_{YAG}/I_{YAP}$ is preferably 0.1 to 10, more preferably 0.1 to 7, and still more preferably 0.2 to 0.5. When the $I_{YAG}/I_{YAP}$ falls within this range, the crystal phase of the composite oxide exists as grains, and the coefficient of thermal conductivity of the AlN sintered compact can be increased, and thus, such is preferred.

As the X-ray diffraction measurement apparatus, for example, PANalytical MPD, manufactured by Spectris Co., Ltd. can be used. The measurement is, for example, performed under a condition of X-ray output (Cu—Kα): 45 kV, 40 mA, scanning axis: θ/2 θ, and measurement range (2 θ): 10° to 90°.

(Median Diameter of Composite Oxide Crystal Grains)

The size of the composite oxide crystal grains which the AlN sintered compact of the present invention contains is defined in terms of a median diameter on the number basis as in the aforementioned case of the AlN crystal grains. As the median diameter of the composite oxide crystal grains in the AlN sintered compact is smaller, the mechanical strength of the AlN sintered compact becomes higher. In addition, in the case where the composite oxide crystal grains are larger than the AlN crystal grains, the composite oxide crystal grains themselves become the starting point of destruction, and therefore, it is preferred that the median diameter of the composite oxide crystal grains is smaller than the median diameter of the AlN crystal grains. The median diameter of the composite oxide crystal grains is preferably 1.5 µm or less, and more preferably 1.0 µm or less.

The median diameter of the composite oxide crystal grains can be determined by observing a fracture surface of the AlN sintered compact with a scanning electron microscope at a magnification of 1,000 times or more and by measuring the grain diameter of at least 200 composite oxide crystal grains in an arbitrary region of 100 µm in square. Since the composite oxide crystal grain is not perfectly spherical, the longest diameter thereof is defined as the grain diameter of the composite oxide crystal grain as in the aforementioned case of the AlN crystal grains. As mentioned above, for example, in the SEM image as shown in FIG. 1, grains that look relatively bright are a composite oxide crystal grain.

(Intergrain Voids)

In the AlN sintered compact of the present invention, the intergrain voids are dispersed, and when the fracture surface of the AlN sintered compact is observed with a scanning electron microscope, the intergrain voids having a longest diameter of 0.2 to 1 µm are dispersed and exist in the number of 10 to 200, preferably 20 to 170, and more preferably 50 to 130 in a visual region of 100 µm in square of a cross section of the AlN sintered compact. The intergrain voids basically look black in the SEM image and even when the contrast is changed, the intergrain voids are not observed bright. What is meant by that the intergrain voids are dispersed is that the intergrain voids having a longest diameter of 0.2 to 1 µm do not become an intergrain void having a longest diameter of more than 1 µm upon being connected with each other. In addition, in another view, the intergrain voids having a longest diameter of 0.2 to 1 µm are each surrounded by the AlN crystal grains or the composite oxide crystal grains and isolated, and they are separated from each other. In the case where the intergrain voids are dispersed in the AlN sintered compact of the present invention according to the aforementioned mode, the mechanical strength is high, and the variation in the strength within the AlN sintered compact is small.

In this specification, the size of the intergrain void is determined by observing the fracture surface of the AlN sintered compact with a scanning electron microscope at a magnification of 1,000 times and by measuring the longest diameter. The longest diameter of the intergrain void is defined as a dimeter when a shape of the intergrain void is close to a sphere; a length of the longest diagonal line when a shape of the intergrain void is close to a convex polygon; and a half of the perimeter of the intergrain void when a shape of the intergrain void is indeterminate form other than the foregoing shapes. The number of intergrain voids is defined as an arithmetic average of measured values of at least two visual fields of the SEM image in an arbitrary region of 100 µm in square.

On the occasion of preparing the fracture surface of the AlN sintered compact, it may be considered that the crystal grains fall off. At that time, it may be hardly considered that two or more crystal grains having the size of one crystal grain in the in-plane direction of the fracture surface and connected with each other in the depth direction fall off. Then, in the case where there is a part that looks black in the SEM image but is hardly judged whether it is an intergrain void or a falling-off part, the judgement is made in the following manner. That is, in the case where there is a part that looks as a black space in the SEM image of the fracture surface of the AlN sintered compact at a magnification of 1,000 times, the magnification is enlarged to 3,000 times to observe the fracture surface of the AlN sintered compact. If the part is observed to be shallower than the depth of the size of one AlN crystal grain in the in-plane direction of the fracture surface and the AlN crystal grain or the composite oxide crystal grain is observed as a bottom of a space, the part is judged as a falling-off part in which the AlN crystal grain or the composite oxide crystal grain has fallen off. Conversely, even when enlarging the magnification to 3,000 times to observe the fracture surface of the AlN sintered compact, if the AlN crystal grain or the composite oxide crystal grain is not observed up to the depth of the size of one AlN crystal grain in the in-plane direction of the fracture surface, the space is judged as the intergrain void. In this specification, in the case where a part that looks black is hardly judged as the intergrain void, the part where the bottom is observed in the space as mentioned above is judged as the falling-off part, and the part where the bottom is not observed in the space is judged as the intergrain void.

In this specification, voids having a longest diameter of smaller than 0.2 µm are not counted as the intergrain void. Even when supposing that voids having a longest diameter of smaller than 0.2 µm would be further finely dispersed within the AlN sintered compact, it may be considered to cause no problem when the mechanical strength is obtained as in the section of Examples. On the other hand, in the case where large intergrain voids having a longest diameter of more than 1 µm are present, there is a concern that when a stress is applied, they become the starting point of destruction. For example, it is preferred that intergrain voids having a longest diameter of more than 10 µm are not present, and furthermore, it is more preferred that intergrain voids having a longest diameter of more than 1 µm are not present, too.

(Carbon Atom Content)

The carbon atom content of the AlN sintered compact of the present invention is less than 0.10% by mass, and preferably 0.09% by mass or less. When the carbon atom content which the AlN sintered compact contains falls within this range, the mechanical strength of the AlN sintered compact can be enhanced. The carbon atom content which the AlN sintered compact contains is determined by the method described in the section of Examples.

(Three-Point Flexural Strength at Room Temperature)

The mechanical strength of the AlN sintered compact may be measured in conformity with the measurement method for three-point flexural strength at room temperature (JIS-R-1601:2008) according to the JIS standards. Specifically, though the measurement is performed in the manner described in the section of Examples, 100 test pieces prepared from ten AlN sintered compacts in a sheet-like form are measured for the three-point flexural strength under a predetermined condition, and an arithmetic average thereof is determined.

In the AlN sintered compact of the present invention, the arithmetic average value of the three-point flexural strength determined by the aforementioned method is preferably 600 MPa or more, and more preferably 650 MPa or more.

(Weibull Modulus)

The variation in the strength within the AlN sintered compact can be expressed in terms of a Weibull modulus, and as the Weibull modulus is larger, the variation in the strength within the AlN sintered compact becomes smaller. In general, it is said that the Weibull modulus of AlN sintered compacts is about 10 ("Introduction to Ceramic Materials and Technologies", published in April 1979 by Sangyo Gijutsu Center K.K.). In order to suppress the probability of defective products to be caused due to an insufficiency of mechanical strength to low levels, it is required that the Weibull modulus is larger than 10.

In this specification, the Weibull modulus is determined according to the later-mentioned formula described in the section of Examples by using 100 measured values of the three-point flexural strength at room temperature as mentioned above.

In the AlN sintered compact of the present invention, the Weibull modulus is preferably larger than 10, and more preferably 15 or larger.

In the AlN sintered compact of the present invention, since the median diameter of the AlN crystal grains is 2 µm or less, not only the three-point flexural strength is larger than 600 MPa, and since 100 to 200 intergrain voids having a longest diameter of 0.2 to 1 µm are uniformly dispersed in a region of a cross section of 100 µm in square in the AlN sintered compact and the carbon atom content is less than 0.10% by mass, the Weibull modulus is larger than 10.

(Production Method of Aluminum Nitride Sintered Compact)

The production method of the aluminum nitride sintered compact of the present invention includes a primary mixing step of mixing a raw material powder containing an aluminum nitride powder and a sintering aid with an organic solvent to obtain a raw material slurry; a secondary mixing step of mixing the raw material slurry with a binder solution to obtain a mixture, followed by filtration of the mixture to obtain a mixed slurry; a molding step of molding the mixed slurry to obtain an aluminum nitride molded compact; a degreasing step of heating the aluminum nitride molded compact to lower than 600° C. in an oxidative gas atmosphere to obtain an aluminum nitride degreased compact; and a sintering step of sintering the aluminum nitride degreased compact to obtain an aluminum nitride sintered compact. The respective steps are hereunder described in detail.

(Primary Mixing Step)

In the primary mixing step, a raw material powder containing an AlN powder and a sintering aid is mixed with an organic solvent to obtain a raw material slurry.

Similarly to the aforementioned case of the AlN crystal grains, the size of the AlN powder to be used is preferably 2 μm or less, more preferably 1 μm or less in terms of a median diameter measured on the SEM image. In addition, the oxygen atom content of the AlN powder is preferably 0.5 to 3% by mass, and preferably 1 to 2% by mass from the viewpoint of allowing the oxygen atom content contained in an AlN degreased compact obtained in a degreasing step as mentioned later to fall within a suitable range.

It is preferred that the sintering aid contains a compound containing one or more elements selected from the group consisting of yttrium-based and lanthanide-based rare earth elements. Specifically, as the foregoing compound, an oxide or oxides of one or more elements selected from the group consisting of yttrium-based and lanthanide-based rare earth elements can be used, and yttrium oxide ($Y_2O_3$) is preferred. As for the yttrium oxide, commercially available products having a grain diameter of approximately 1 μm can be used and are preferred. In addition, from the viewpoint of regulating the oxygen atom content contained in the AlN degreased compact in the AlN degreased compact as mentioned later, the sintering aid may further contain a compound having an aluminum element. Specifically, an oxide of an aluminum element may be added as the compound having an aluminum element to the sintering aid, and as for the aluminum oxide ($Al_2O_3$), commercially available products having a grain diameter of approximately 1 μm can be used and are preferred. In addition, as the sintering aid, a precursor capable of forming an oxide or oxides of one or more elements selected from the group consisting of an aluminum element and yttrium-based and lanthanide-based rare earth elements can also be used.

The addition amount of the sintering aid is preferably 0.01 to 15% by mass relative to the sum total of the AlN powder and the sintering aid. When the addition amount of the sintering aid falls within this range, the AlN sintered compact is effectively densified in the sintering step as mentioned later. The addition amount of the sintering aid is more preferably 0.1 to 15% by mass, and still more preferably 0.5 to 10% by mass. When the addition amount of the sintering aid falls within this range, not only the impurity oxygen in the AlN crystal grains is efficiently removed, but also the composite oxide crystal grains become an appropriate amount, and the coefficient of thermal conductivity of the resulting AlN sintered compact becomes high. In the case where the sintering aid contains aluminum oxide, aluminum oxide can be mixed after calculation such that the amount of aluminum oxide relative to the amount of the oxide or oxides of one or more elements selected from the group consisting of yttrium-based and lanthanide-based rare earth elements becomes a ratio of the amounts of $REAlO_3$ and $Re_3Al_5O_{12}$ which the crystal phase in the aforementioned composite oxide crystal grains contains. For example, when aiming at $I_{YAG}/I_{YAP}$=about 0.3, 0.34 parts by mass of aluminum oxide ($Al_2O_3$) is mixed based on 1 part by mass of yttrium oxide ($Y_2O_3$). Actually, the AlN powder to be used contains the impurity oxygen, and oxygen is incorporated from air in the mixing step, etc. during the production, and therefore, the amount of the aluminum oxide is regulated according to the oxygen atom amount which the composite oxide crystal grains trap, while repeating experiments.

Examples of the organic solvent include methanol, 1-butanol, 2-butanone, methyl ethyl ketone (MEK), and xylene. Of these, 1-butanol and 2-butanone are preferred, and a mixture of 1-butanol and 2-butanone is more preferably used.

In the primary mixing step, a polyethylene glycol-based nonionic dispersant, such as polyoxyethylene lauryl ether, and a plasticizer, such as dibutyl phthalate and butyl phthalyl butyl glycolate, may be further added.

Mixing of the primary mixing step can be performed using a ball mill, a vibrating mill, an attritor, or the like. In order to suppress incorporation of impurities, such as a transition metal element, the material of a mixing vessel is preferably a resin or high-purity alumina, and the material of a crushing ball is preferably high-purity alumina. In particular, the crushing ball is suitably high-purity alumina having a purity of 99.9% by mass or more.

In the primary mixing step, the AlN powder is finely crushed. In the subsequent steps, it may be considered that the grain diameter of the AlN powder grains does not largely change. Accordingly, it is preferred that at this stage, the AlN powder is crushed in the primary mixing step such that the average grain diameter of the AlN powder grains reaches, as a targeted value, the grain diameter of the AlN powder grains which the AlN degreased compact obtained in the degreasing step as mentioned later contains. The grain diameter of the AlN powder grains which the AlN degreased compact contains can be confirmed in terms of a median diameter to be measured from the SEM image.

(Secondary Mixing Step)

In the secondary mixing step, the raw material slurry obtained in the primary mixing step is mixed with a separately prepared binder solution to obtain a mixture, and the mixture is then filtered to obtain a mixed slurry. The binder solution is obtained by dissolving the binder component in an organic solvent.

The binder is preferably an organic compound, such as polyvinyl butyral, a paraffin wax, ethyl cellulose, and an acrylic resin, and more preferably polyvinyl butyral.

For the organic solvent to be used for preparing the binder solution, the same organic solvent used in the preparation of the aforementioned raw material slurry is preferably used. In the case of using a mixture of plural organic solvents, a mixing ratio can be appropriately changed according to the characteristics of the solute.

As for the mixing amount of the binder solution relative to the raw material slurry, the binder solution is mixed such that the binder is added in an amount of preferably 3 to 15 parts by mass, and more preferably 3 to 10 parts by mass based on 100 parts by mass of the sum total of the AlN powder and the sintering aid which the raw material slurry contains.

In the secondary mixing step, a polyethylene glycol-based nonionic dispersant, such as polyoxyethylene lauryl ether, and a plasticizer, such as dibutyl phthalate and butyl phthalyl butyl glycolate, may be further added.

Mixing of the secondary mixing step can be performed using the same method as the method used in the primary mixing step as mentioned above.

As for the filtration on the occasion of obtaining the mixed slurry through filtration of the mixture, a method, such as natural filtration, pressure filtration, and vacuum filtration, can be adopted, and the filtration is preferably performed by means of pressure filtration from the standpoint that the filtration can be performed without spending a time such that the components in the mixture are not unevenly distributed due to sedimentation or the like. In addition, in the case of performing the filtration by means of pressure filtration, though compressed air can be used as a pressurized gas, from the viewpoint of suppressing unnecessary oxidation of the AlN powder in the mixture, it is preferred to pressurize the mixture with an inert gas, such as a nitrogen gas. The pressure used for the pressurization is appropriately adjusted according to the amount and viscosity of the mixture as well as the characteristics of a pressure filtration apparatus.

A filter medium is selected according to the grain diameter of the powder which the mixture to be filtered contains, and for example, it is selected according to the retained grain diameter of the filter medium. The retained grain diameter of the filter medium is preferably 0.8 to 4 μm, more preferably 0.8 to 2 μm, and still more preferably 0.8 to 1 μm. As for the kind of the filter medium, for example, a cellulosic filter paper can be used. By performing the filtration with such a filter medium, in the case where an insoluble block is generated during the primary mixing step and the secondary mixing step, this can be removed.

It is preferred to subject the resulting mixed slurry to a defoaming treatment, as the need arises. For the defoaming treatment of the mixed slurry, a commercially available vacuum pump can be used.

(Binder Solution Preparation Step)

In the production method of the aluminum nitride sintered compact of the present invention, a binder solution preparation step of dissolving the binder component in an organic solvent to obtain a binder solution may be further included prior to the secondary mixing step. The binder solution is preferably one having been filtered. As for the method of filtering the solution obtained by dissolving the binder component in an organic solvent, the filtration can be performed by the same method as the method of filtering the mixture in the aforementioned secondary mixing step. By filtering the solution obtained by dissolving the binder component in an organic solvent to obtain the binder solution, in the case where an insoluble binder component as a block is generated, this can be removed. The retained grain diameter of the filter medium to be used in the binder solution preparation step is preferably equal to or not more than 2 times of the retained grain diameter of the filter medium used in the secondary mixing step.

(Molding Step)

In the molding step, the mixed slurry obtained in the secondary mixing step is molded in a sheet-like form, and if desired, the solvent is removed by means of air-drying or the like, to obtain an AlN molded compact. The thickness of the AlN molded compact in a sheet-like form is preferably 0.5 to 2 mm. Examples of the molding measure include methods, such as a method using a dry pressing machine or a rubber pressing machine, an extrusion method, an injection method, and a doctor blade method. For the preparation of an AlN sintered compact substrate, molding is typically performed by a doctor blade method. In addition, the AlN molded compact can also be obtained by subjecting the mixed slurry to dry granulation, followed by molding by a mold molding method. The resulting AlN molded compact can be cut in appropriate size and shape, as the need arises.

(Degreasing Step)

In the degreasing step, the AlN molded compact is heated to lower than 600° C. in an oxidative gas atmosphere to obtain an AlN degreased compact. By performing degreasing, the binder component which the AlN molded compact contains is decomposed. As the oxidative gas, a mixed gas having an oxygen gas mixed therein is preferably used. The content of the oxygen gas which the mixed gas contains is preferably 5 to 25% by volume, and more preferably 5 to 20% by volume, and for example, air can be preferably used. The degreasing is performed by heating to a temperature at which the binder component is decomposed or higher and lower than 600° C. The degreasing is preferably performed by heating to 400° C. or higher and lower than 600° C., and it is performed preferably for 0.1 to 24 hours, and more preferably for 1 hour to 8 hours. By performing the degreasing at lower than 600° C., oxidation of the AlN crystal grain in the AlN molded compact can be suppressed.

As a degreasing furnace for performing the degreasing, commercially available products can be used. It is preferred that the degreasing furnace is provided with a wax trapping mechanism of trapping the removed component originated from the binder component removed from the AlN molded compact.

Similarly to the aforementioned method of determining the longest diameter of the AlN crystal grains, the size of the AlN powder grains which the AlN degreased compact contains can be defined in terms of a median diameter obtained by observing the surface of the AlN degreased compact by an SEM image at a magnification of 1,000 times and by measuring the longest diameters of at least 500 arbitrary AlN powder grains from a region of 100 μm in square. The AlN powder grains which the AlN degreased compact contains are different in an element composition from the grains of the aluminum oxide powder added as the sintering aid, or the like, and therefore, they can be distinguished in the SEM image and can also be confirmed in terms of the element composition using the aforementioned SEM-EDS analysis, if desired. When the AlN powder grains are sufficiently small, the impurity oxygen in the interiors of the AlN powder grains can be efficiently removed at an appropriate binder amount. The average grain diameter of the AlN powder which the AlN degreased compact contains is preferably 0.8 μm or less, more preferably 0.5 μm or less, and still more preferably 0.4 μm or less.

When the degreasing step is performed under the foregoing condition, the carbon atom content which the AlN degreased compact contains becomes preferably 0.10% by mass or less, and more preferably 0.09% by mass or less. When the carbon atom content which the AlN degreased compact contains falls within this range, not only the impurity oxygen which the AlN powder contains can be thoroughly removed, but also the dispersion mode of the inter-grain voids in the aluminum nitride sintered compact obtained after the sintering step can be made to fall within the aforementioned range. The carbon atom content which the AlN degreased compact contains can be determined by the method described in the section of Examples.

(Sintering Step)

In the sintering step, the AlN degreased compact is sintered to obtain an AlN sintered compact. The sintering is performed by heating preferably in an inert gas atmosphere at 1,400° C. or higher and 1,800° C. or lower for 24 hours or less, and more preferably in an atmospheric-pressure inert gas atmosphere at 1,400 to 1,800° C. for 20 minutes to 24 hours. The sintering temperature is more preferably 1,500 to 1,800° C., and still more preferably 1,650 to 1,800° C. Though the sintering time is adjusted according to the sintering temperature, the sintering is performed for preferably 20 minutes to 18 hours, more preferably 30 minutes to 12 hours, and still more preferably 30 minutes to 6 hours. As the inert gas, a nitrogen gas can be preferably used.

By sintering the AlN degreased compact under the conditions falling within the ranges, the carbon atom content of the AlN sintered compact becomes less than 0.10% by mass, and preferably 0.09% by mass or less. The carbon atom content which the AlN sintered compact contains is determined by the method described in the section of Examples.

By performing the sintering step under the foregoing conditions, the median diameter of the aluminum nitride crystal grains in the resulting AlN sintered compact becomes 2 μm or less, preferably 1.7 μm or less, and more preferably 1.5 μm or less. In the case where the AlN crystal grains are not coarsened, the AlN sintered compact has a high mechanical strength.

By performing the sintering step under the foregoing conditions, the number of the intergrain voids having a longest diameter of 0.2 to 1 μm, which are dispersed and exist in the resulting AlN sintered compact, becomes 10 to 200, preferably 20 to 170, and more preferably 50 to 130 in a region of 100 μm in square of a cross section of the AlN sintered compact. When the number of the intergrain voids having the aforementioned predetermined size falls within the ranges, the AlN sintered compact has a high mechanical strength.

In the light of the above, the embodiments of the present invention have been described, but the present invention is not limited to the aforementioned embodiments and can include all aspects included in the concept of the present invention and the claims, and various modifications can be made within the scope of the present invention.

EXAMPLES

The present invention is hereunder specifically described by reference to Examples. It should be construed that the present invention is not limited only to the Examples.

Measurement of the carbon atom content, determination of the median diameter of crystal grains or the like, measurement of the number of intergrain voids, measurement of the number of carbon-containing materials, determination method of the crystal phase, measurement of the three-point flexural strength at room temperature, and determination of the Weibull modulus were performed by the respective methods described blow.

(Carbon Atom Contents of AlN Degreased Compact and AlN Sintered Compact)

An appropriate amount of an AlN degreased compact or an AlN sintered compact was crushed using a mortar, 0.2 g of which was then weighed in a ceramic crucible; the same mass of a metallic tungsten powder as a combustion improver was added; the measurement was performed using a carbon/sulfur analyzer, EMIA-920V (manufactured by Horiba, Ltd.) by the infrared absorption method; and an arithmetic average value of measured values of two samples was determined.

(Median Diameter of AlN Crystal Grains)

A fracture surface of an AlN sintered compact was prepared and subjected to cross-sectional observation with a scanning electron microscope (SEM), JSM-7500FA (manufactured by JEOL Ltd., accelerating voltage: 5.0 kV) at a magnification of 1,000 times, and the longest diameter of AlN crystal grains was measured and defined as the grain diameter of the AlN crystal grains. The grain diameter of 500 AlN crystal grains in an arbitrary region of 100 μm in square was measured to determine the median diameter of the AlN crystal grains on the number basis.

(Median Diameter of Composite Oxide Crystal Grains)

A fracture surface of an AlN sintered compact was observed with a scanning electron microscope (SEM) at a magnification of 1,000 times, and the longest diameter of composite oxide crystal grains was measured and defined as the grain diameter of the composite oxide crystal grains. The grain diameter of 200 composite oxide crystal grains in an arbitrary region of 100 μm in square was measured to determine the median diameter of the composite oxide crystal grains on the number basis.

(Number of Intergrain Voids)

A fracture surface of an AlN sintered compact was observed with a scanning electron microscope (SEM) at a magnification of 1,000 times, and the longest diameter of the intergrain voids in the in-plane direction of the SEM image was measured to obtain each of the number of intergrain voids having a size of 0.2 to 1 μm in terms of a longest diameter and the number of intergrain voids having a size of more than 1 μm in terms of a longest diameter. The number of intergrain voids was defined as an arithmetic average of measured values of two arbitrary visual fields of the SEM image in 100 μm square. The value was rounded off as needed in order to obtain an integer.

(Number of Carbon-Containing Materials)

A fracture surface of an AlN sintered compact was observed with a scanning electron microscope (SEM) at a magnification of 1,000 times; the carbon-containing materials were specified by the SEM-EDS analysis; and the longest diameter in the in-plane direction of the SEM image was measured to obtain the number of carbon-containing materials having a size of more than 1 μm in terms of a longest diameter. The number of carbon-containing materials was defined as an arithmetic average of measured values of two arbitrary visual fields of the SEM image in 100 μm square. The determined average value was rounded off as needed in order to obtain an integer.

(X-Ray Diffraction Measurement)

An AlN sintered compact was subjected to X-ray diffraction measurement using a powder X-ray diffraction measurement apparatus, PANalytical MPD (manufactured by Spectris Co., Ltd.). As for the measurement conditions, the measurement was performed using a Cu—Kα ray (output: 45 kV, 40 mA) under conditions of scanning axis: θ/2 θ, measurement range (2 θ): 10° to 90°, measurement mode: FT, read width: 0.02°, sampling time: 0.70 seconds, DS, SS, RS: 0.5°, 0.5°, and 0.15 mm, and in the resulting X-ray diffraction pattern, the crystal phases of the AlN crystal grains and the composite oxide crystal grains were identified.

(Three-Point Flexural Strength at Room Temperature)

100 test pieces of 40 mm×4 mm×0.635 mm in thickness were prepared from ten sheets of an AlN sintered compact, and the three-point flexural strengths of the resulting test pieces were measured in conformity with the measurement method for the three-point flexural strength at room temperature (JIS-R-1601:2008) according to the JIS standards under conditions of an outer fulcrum distance of 30 mm and a crosshead speed of 0.5 mm/min at room temperature (20 to 25° C.). An arithmetic average value of the resulting 100 three-point flexural strength values was calculated.

(Weibull Modulus)

The strength of a ceramic material can be described in terms of a Weibull statistics display on the basis of a weakest link model as a probability distribution statistically describing the strength.

The Weibull modulus was calculated from the three-point flexural strength regarding the 100 test pieces obtained in the aforementioned three-point flexural strength measurement in the following manner.

[Math. 1]
μ: Average strength
i: Ordinal number of strength
$\sigma_i$: Strength of test piece i
$F_i$: Cumulative fracture probability of test piece i
N Total number of test pieces When among the test pieces, a test piece having a smallest $\sigma_i$ is defined to establish i=1, and i is sequentially given to the test pieces in ascending order of $\sigma_i$, the cumulative fracture probability $F_i$, of the test piece i is expressed in terms of a median rank as follows.

$$F_i = \frac{i - 0.3}{N + 0.4}$$

The average strength $\mu$ is expressed in terms of a $\Gamma$ function as follows.

$$\mu = \eta \Gamma\left(1 + \frac{1}{m}\right)$$

$\eta$: Scale parameter

The cumulative fracture probability $F_i$ is expressed as follows.

$$F_i = 1 - \exp\left\{-\left(\frac{\sigma_i}{\eta}\right)^m\right\}$$

m: Weibull modulus

This equation is transformed into the following equation.

$$\ln\left(\ln\frac{1}{1-F_i}\right) = m \ln \sigma_i + m \ln\left\{\frac{1}{\mu}\Gamma\left(\frac{m+1}{m}\right)\right\}$$

The Weibull modulus m is determined from the gradient of line when plotting $$\ln\left(\ln\frac{1}{1-F_i}\right)$$

on the ordinate and $\ln \sigma_i$ on the abscissa, respectively.

Example 1

(Primary Mixing Step)

To 92.7 parts by mass of an AlN powder (manufactured by Toyo Aluminium K.K., model number: JC (grain size $D_{50}$: 1.2 μm, oxygen atom content: 0.9% by mass, median diameter: 0.9 μm, Fe atom content: 15 ppm by mass, Si atom content: 40 ppm by mass)), 6 parts by mass of a yttrium oxide ($Y_2O_3$) powder (manufactured by Shin-Etsu Chemical Co., Ltd., model number: RU-P (average grain diameter: 1 μm)) and 1.3 parts by mass of an aluminum oxide ($Al_2O_3$) powder (manufactured by Sumitomo Chemical Co., Ltd., model number: AKP-50 (central grain diameter (MT3300: 0.20 μm))) as a sintering aid, 3 parts by mass of polyoxyethylene lauryl ether as a dispersant, and 30 parts by mass of 1-butanol and 24 parts by mass of 2-butanone as an organic solvent (1) were added, and the contents were crushed and mixed in a nylon-made ball mill pot by using high-purity alumina balls having a diameter of 5 mm for 24 hours, thereby obtain a raw material slurry.

(Binder Solution Preparation Step)

5 parts by mass of polyvinyl butyral as a binder component, 5 parts by mass of dibutyl phthalate as a plasticizer, and 8 parts by mass of 1-butanol and 7 parts by mass of 2-butanone as an organic solvent (2) were mixed to obtain a solution, and this solution was filtered with a versatile disk filter holder (manufactured by Advantec Toyo Kaisha, Ltd., model number: KST-142-UH) set with a filter paper having a retained grain diameter of 1 μm (manufactured by Advantec Toyo Kaisha, Ltd., model number: No. 5C) under a pressurized condition of 0.3 MPa of a nitrogen gas, thereby obtaining a binder solution.

(Secondary Mixing Step)

To the raw material slurry obtained in the primary mixing step, the binder solution was added in such an amount that the addition amount of polyvinyl butyral was 5 parts by mass based on 100 parts by mass in total of the AlN powder, the $Y_2O_3$ powder, and the $Al_2O_3$ powder in the raw material slurry, and the contents were mixed in a nylon-made ball mill pot by using high-purity alumina balls having a diameter of 5 mm for 24 hours. The resulting mixture was filtered with a versatile disk filter holder (manufactured by Advantec Toyo Kaisha, Ltd., model number: KST-142-UH) set with a filter paper having a retained grain diameter of 1 μm (manufactured by Advantec Toyo Kaisha, Ltd., model number: No. 5C) under a pressurized condition of 0.3 MPa of a nitrogen gas, thereby obtaining a mixed slurry. Furthermore, the mixed slurry was subjected to a defoaming treatment by sucking with a vacuum pump while stirring.

(Molding Step)

The mixed slurry was subjected to sheet molding by the doctor blade method, and the solvent was removed by means of air-drying for 8 hours, thereby obtaining a 1 mm-thick sheet composed of an AlN molded compact. Furthermore, this sheet was punched out in a square shape having a size of 70 mm×70 mm.

(Degreasing Step)

The square-shaped sheet composed of an AlN molded compact, which was obtained in the molding step, was applied with a boron nitride fine powder (manufactured by Showa Denko K.K., model number: UHP-1K) as an adhesion preventing sprinkle powder. Ten of the resulting sheets were piled up and accommodated in a boron nitride-made container, which was then held in an atmospheric-pressure air stream under a condition at 500° C. for 2 hours, thereby achieving degreasing. As a degreasing furnace, an external heating-type tubular furnace having a stainless steel-made furnace tube provided with a wax trapping mechanism and a heating element using a kanthal wire was used. The carbon atom content of the resulting AlN degreased compact was 0.09% by mass. The carbon atom content of the AlN degreased compact is shown in Table 2.

(Sintering Step)

The AlN degreased compact obtained in the degreasing step was charged in a boron nitride-made container and sintered for 1 hour by using an internal heating-type sintering furnace having a graphite-made heating element in an atmospheric-pressure nitrogen gas stream under a condition at 1,780° C., thereby obtaining an AlN sintered compact. The carbon atom content of the resulting AlN sintered compact was 0.07% by mass. The carbon atom content of the AlN sintered compact is shown in Table 2.

(Identification of Crystal Phase in AlN Sintered Compact)

The X-ray diffraction measurement of the resulting AlN sintered compact was performed. The AlN sintered compact was confirmed to have a hexagonal system wurtzite structure and a cubic system zinc-blende structure as the AlN crystal grains. The AlN sintered compact was confirmed to have an orthorhombic system perovskite structure ($YAlO_3$) and a cubic system garnet structure ($Y_3Al_5O_{12}$) as a crystal phase of a composite oxide of yttrium and aluminum which the composite oxide crystal grains contained. $I_{YAG}/I_{YAP}$ determined from the diffraction peak height was 0.32. The $I_{YAG}/I_{YAP}$ is shown in Table 2.

(Observation of Fracture Surface of AlN Sintered Compact)

A fracture surface of the AlN sintered compact obtained by fracturing was subjected to cross-sectional observation with a scanning electron microscope (SEM) (JSM-7500FA (manufactured by JEOL Ltd.), accelerating voltage: 5.0 kV) at a magnification of 1,000 times. The median diameter of 500 AlN crystal grains whose longest diameters had been measured was 1.7 µm, and the median diameter of 200 composite oxide crystal grains whose longest diameters had been measured was 1.1 µm. The intergrain voids having a longest diameter of 0.2 µm to 1 µm were uniformly dispersed and existed, the number of which was 24 as an average value in two visual fields, upon observation of the visual field of 100 µm in square. Neither intergrain voids having a longest diameter of more than 1 µm nor carbon-containing materials having a longest diameter of more than 1 µm were observed. The median diameter of the respective crystal grains, the number of the intergrain voids, and the number of the carbon-containing materials are shown together in Table 2.

(Three-Point Flexural Strength and Weibull Modulus)

From ten sheets of the prepared AlN sintered compact, rectangular samples having a size of 40 mm×4 mm were cut out using a diamond cutter. Furthermore, the surfaces of the resulting samples were subjected to grinding processing into a surface roughness Ra of 0.5 µm or less, thereby preparing 100 test pieces having a size of 40 mm×4 mm×0.635 mm in thickness. The three-point flexural strength was measured at room temperature (20 to 25° C.) by using a precision universal testing machine (manufactured by Shimadzu Corporation, model number: AG-X) and a commercially available three-point flexural testing tool under conditions of an outer fulcrum distance of 30 mm and a crosshead speed of 0.5 mm/min in conformity with the three-point flexural strength at room temperature (JIS-R-1601:2008) according to the JIS standards. The arithmetic average value of the three-point flexural strength of the 100 test pieces was 653 MPa, and the Weibull modulus calculated from the three-point flexural strength of the 100 test pieces by the aforementioned method was 15. The average value of the three-point flexural strength and the Weibull modulus are shown together in Table 2.

Examples 2 to 4

AlN sintered compacts were prepared in the same manner as in Example 1, except for changing the preparation condition of the AlN sintered compact as shown in Table 1.

The carbon atom contents of the AlN degreased compact and the AlN sintered compact, the median diameters of the AlN crystal grains and the composite oxide crystal grains, the numbers of the intergrain voids having a longest diameter of 0.2 to 1 µm and more than 1 µm, and the number of the carbon-containing materials having a longest diameter of more than 1 µm were determined in the same manners as in Example 1. The obtained results are shown together in Table 2. In all of the Examples, not only the intergrain voids were uniformly dispersed, but also any intergrain voids having a longest diameter of more than 1 µm were not observed.

The crystal phases in the AlN sintered compacts were also identified in the same manner as in Example 1. In all of the Examples, the crystal phase of the composite oxide of yttrium and aluminum which the composite oxide crystal grains contained was confirmed to have an orthorhombic system perovskite structure ($YAlO_3$) and a cubic system garnet structure ($Y_3Al_5O_{12}$). $I_{YAG}/I_{YAP}$ determined in the same manner as in Example 1 is shown in Table 2.

The three-point flexural strengths at room temperature of the AlN sintered compacts were also measured in the same manner as in Example 1, and the average values of the three-point flexural strength and the Weibull modulus were determined. In addition, the average values of the three-point strength and the Weibull modulus determined in the same manner as in Example 1 are shown together in Table 2.

Comparative Examples 1 to 2

AlN sintered compacts were prepared in the same manner as in Example 1, except for changing the preparation condition of the AlN sintered compact as shown in Table 1.

The carbon atom contents of the AlN degreased compact and the AlN sintered compact, the median diameters of the AlN crystal grains and the composite oxide crystal grains, the numbers of the intergrain voids having a longest diameter of 0.2 to 1 µm and more than 1 µm, and the number of the carbon-containing materials having a longest diameter of more than 1 µm were determined in the same manners as in Example 1. The obtained results are shown together in Table 2. In all of the Comparative Examples, not only the intergrain voids were uniformly dispersed, but also any intergrain voids having a longest diameter of more than 1 µm were not observed.

The crystal phases in the AlN sintered compacts were also identified in the same manner as in Example 1. In all of the Comparative Examples, the crystal phase of the composite oxide of yttrium and aluminum which the composite oxide crystal grains contained was confirmed to have an orthorhombic system perovskite structure ($YAlO_3$) and a cubic system garnet structure ($Y_3Al_5O_{12}$). $I_{YAG}/I_{YAP}$ determined in the same manner as in Example 1 is shown in Table 2.

The three-point flexural strengths at room temperature of the AlN sintered compacts were also measured in the same manner as in Example 1, and the average values of the three-point flexural strength and the Weibull modulus were determined. In addition, the average values of the three-point strength and the Weibull modulus determined in the same manner as in Example 1 are shown together in Table 2.

Comparative Example 3

An AlN sintered compact was prepared in the same manner as in Example 1, except that in the degreasing step, the atmosphere was changed from the air stream to a nitrogen gas stream.

The carbon atom contents of the AlN degreased compact and the AlN sintered compact, the median diameters of the AlN crystal grains and the composite oxide crystal grains, the numbers of the intergrain voids having a longest diameter of 0.2 to 1 µm and more than 1 µm, and the number of the carbon-containing materials having a longest diameter of more than 1 µm were determined in the same manners as in Example 1. The obtained results are shown together in Table 2. In the SEM observation of the fracture surface of the AlN sintered compact, not only the intergrain voids, the number of which was 32, were uniformly dispersed, but also any intergrain voids having a longest diameter of more than 1 µm were not observed. In addition, as the carbon-containing materials having a longest diameter of more than 1 µm, indeterminate formed carbon-containing materials having a longest diameter of 10 µm existed, the number of which was 2 on average, in the observation of two visual fields of the SEM image. The fact that the carbon-containing materials contained a carbon atom was confirmed by the SEM-EDS analysis.

The crystal phases in the AlN sintered compact were also identified in the same manner as in Example 1. In Comparative Example 3, the crystal phase of the composite oxide of yttrium and aluminum which the composite oxide crystal grains contained was confirmed to have an orthorhombic system perovskite structure ($YAlO_3$) and a cubic system garnet structure ($Y_3Al_5O_{12}$). $I_{YAG}/I_{YAP}$ determined in the same manner as in Example 1 is shown in Table 2.

The three-point flexural strength at room temperature of the AlN sintered compact was also measured in the same manner as in Example 1, and the average values of the three-point strength and the Weibull modulus were determined. In addition, the average values of the three-point strength and the Weibull modulus determined in the same manner as in Example 1 are shown together in Table 2.

Comparative Example 4

An AlN sintered compact was prepared in the same manner as in Example 2, except that in the binder solution preparation step, the solution obtained by dissolving the binder component in the organic solvent (2) was not filtered; and that in the secondary mixing step, the filtration of the mixed slurry was not performed.

The carbon atom contents of the AlN degreased compact and the AlN sintered compact, the median diameters of the AlN crystal grains and the composite oxide crystal grains, the numbers of the intergrain voids having a longest diameter of 0.2 to 1 μm and more than 1 μm, and the number of the carbon-containing materials having a longest diameter of more than 1 μm were determined in the same manners as in Example 1. The obtained results are shown together in Table 2. Though the intergrain voids were uniformly dispersed, as the intergrain voids having a longest diameter of more than 1 μm, amorphous intergrain voids having a longest diameter of 10 μm or more existed, the number of which was 2 on average, in the observation of two visual fields of the SEM image.

The crystal phases in the AlN sintered compact were also identified in the same manner as in Example 1. In Comparative Example 4, the crystal phase of the composite oxide of yttrium and aluminum which the composite oxide crystal grains contained was confirmed to have an orthorhombic system perovskite structure ($YAlO_3$) and a cubic system garnet structure ($Y_3Al_5O_{12}$). $I_{YAG}/I_{YAP}$ determined in the same manner as in Example 1 is shown in Table 2.

The three-point flexural strength at room temperature of the AlN sintered compact was also measured in the same manner as in Example 1, and the average values of the three-point strength and the Weibull modulus were determined. In addition, the average values of the three-point strength and the Weibull modulus determined in the same manner as in Example 1 are shown together in Table 2.

TABLE 1

|  | Unit | Example 1 | Example 2 | Example 3 | Example 4 | Comparative Example 1 | Comparative Example 2 | Comparative Example 3 | Comparative Example 4 |
|---|---|---|---|---|---|---|---|---|---|
| AlN | Parts by mass | 92.7 | 92.9 | 92.7 | 92.7 | 92.7 | 91.2 | 92.7 | 92.9 |
| $Y_2O_3$ | Parts by mass | 6 | 6 | 6 | 6 | 6 | 6 | 6 | 6 |
| $Al_2O_3$ | Parts by mass | 1.3 | 1.1 | 1.3 | 1.3 | 1.3 | 2.8 | 1.3 | 1.1 |
| Polyoxyethylene lauryl ether | Parts by mass | 3 | 3 | 3 | 3 | 3 | 3 | 3 | 3 |
| Polyvinyl butyral | Parts by mass | 5 | 5 | 5 | 5 | 5 | 5 | 5 | 5 |
| Dibutyl phthalate | Parts by mass | 5 | 5 | 5 | 5 | 5 | 5 | 5 | 5 |
| 1-Butanol | Parts by mass | 38 | 38 | 38 | 38 | 38 | 38 | 38 | 38 |
| 2-Butanone | Parts by mass | 31 | 31 | 31 | 31 | 31 | 31 | 31 | 31 |
| Filtration of mixed slurry | — | Yes | Yes | Yes | Yes | Yes | Yes | Yes | No |
| Primary mixing time | Hours | 24 | 40 | 24 | 24 | 24 | 4 | 24 | 40 |
| Secondary mixing time | Hours | 24 | 24 | 24 | 24 | 24 | 24 | 24 | 24 |
| Degreasing atmospheric gas | — | Air | Air | Air | Air | Air | Air | Nitrogen gas | Air |
| Degreasing temperature | °C. | 500 | 500 | 500 | 500 | 500 | 500 | 500 | 500 |
| Degreasing time | Hours | 2 | 2 | 2 | 2 | 2 | 2 | 2 | 2 |
| Sintering temperature | °C. | 1780 | 1780 | 1760 | 1800 | 1800 | 1775 | 1780 | 1780 |
| Sintering time | Hours | 1 | 0.5 | 2 | 0.5 | 1 | 2 | 1 | 0.5 |

TABLE 2

| | Unit | Example 1 | Example 2 | Example 3 | Example 4 | Comparative Example 1 | Comparative Example 2 | Comparative Example 3 | Comparative Example 4 |
|---|---|---|---|---|---|---|---|---|---|
| Carbon atom content of degreased compact | % by mass | 0.09 | 0.10 | 0.08 | 0.09 | 0.08 | 0.09 | 0.51 | 0.11 |
| Carbon atom content of sintered compact | % by mass | 0.07 | 0.09 | 0.05 | 0.06 | 0.06 | 0.05 | 0.36 | 0.10 |
| Median diameter of AlN crystal grains | μm | 1.7 | 1.5 | 2 | 1.9 | 2.2 | 2.4 | 1.7 | 1.5 |
| Median diameter of composite oxide crystal grains | μm | 1.1 | 1 | 1.1 | 1.1 | 1.4 | 1.2 | 1.1 | 1 |
| Number of intergrain voids having a longest diameter of 0.2 μm or more and 1 μm or less | Piece | 24 | 101 | 156 | 15 | 5 | 220 | 32 | 113 |
| Number of intergrain voids having a longest diameter of more than 1 μm and number of carbon-containing materials | Piece | 0 | 0 | 0 | 0 | 0 | 0 | Number of carbon-containing materials having a longest diameter of 10 μm: 2 | Number of intergrain voids having a longest diameter of 10 μm or more: 2 |
| $I_{YAG}/I_{YAP}$ | — | 0.32 | 0.35 | 0.29 | 0.33 | 0.34 | 0.38 | 0.31 | 0.33 |
| Three-point flexural strength | MPa | 653 | 673 | 610 | 628 | 588 | 575 | 630 | 634 |
| Weibull modulus | — | 15 | 21 | 15 | 13 | 10 | 9 | 9 | 8 |

(Measurement of Coefficient of Thermal Conductivity)

The coefficient of thermal conductivity of the AlN sintered compact prepared in Example 2 was measured and determined with a measuring apparatus manufactured by Advance Riko, Inc. (model: TC-1200RH) under a condition of an excitation voltage of an Nd gas laser of 2.0 kV by the laser flash method (two-dimensional method), and as a result, it was found to be 150 W/(m·K).

INDUSTRIAL APPLICABILITY

The aluminum nitride sintered compact of the present invention has high heat dissipation, has a high strength (for example, the three-point flexural strength at room temperature is 600 MPa or more), and is small in the variation of strength within the aluminum nitride sintered compact (for example, the Weibull modulus is more than 10), and therefore, it can be suitably used for circuit boards which are required to have high reliability, for example, circuit boards for power module.

The invention claimed is:

1. An aluminum nitride sintered compact comprising aluminum nitride crystal grains and composite oxide crystal grains containing a rare earth element and an aluminum element, wherein
   a median diameter of the aluminum nitride crystal grains is 2 μm or less;
   10 to 200 intergrain voids having a longest diameter of 0.2 to 1 μm are dispersed in a region of a cross section of 100 μm in square; and
   the carbon atom content is less than 0.10% by mass.

2. The aluminum nitride sintered compact according to claim 1, wherein a median diameter of the composite oxide crystal grains is smaller than the median diameter of the aluminum nitride crystal grains.

3. The aluminum nitride sintered compact according to claim 1, wherein the median diameter of the composite oxide crystal grains is 1.5 μm or less.

4. The aluminum nitride sintered compact according to claim 1, wherein the rare earth element is one or more elements selected from the group consisting of yttrium-based and lanthanide-based rare earth elements.

5. A method of producing an aluminum nitride sintered compact that is the aluminum nitride sintered compact according to claim 1, the method comprising
   a primary mixing step of mixing a raw material powder containing an aluminum nitride powder and a sintering aid with an organic solvent to obtain a raw material slurry;
   a secondary mixing step of mixing the raw material slurry with a binder solution to obtain a mixture, followed by filtration of the mixture to obtain a mixed slurry;
   a molding step of molding the mixed slurry to obtain an aluminum nitride molded compact;
   a degreasing step of heating the aluminum nitride molded compact to lower than 600° C. in an oxidative gas atmosphere to obtain an aluminum nitride degreased compact; and
   a sintering step of sintering the aluminum nitride degreased compact to obtain an aluminum nitride sintered compact.

6. The method of producing an aluminum nitride sintered compact according to claim 5, wherein the sintering aid contains a compound having one or more elements selected from the group consisting of yttrium-based and lanthanide-based rare earth elements.

7. The method of producing an aluminum nitride sintered compact according to claim 6, wherein the sintering aid further contains a compound having an aluminum element.

8. The method of producing an aluminum nitride sintered compact according to claim 5, further comprising a binder solution preparation step of dissolving a binder component in an organic solvent to obtain a solution, followed by filtration of the solution to obtain the binder solution, prior to the secondary mixing step.

9. The method of producing an aluminum nitride sintered compact according to claim 5, wherein the oxidative gas to be used in the degreasing step is a mixed gas containing an oxygen gas.

10. The method of producing an aluminum nitride sintered compact according to claim 5, wherein the carbon atom content of the aluminum nitride degreased compact is 0.10% by mass or less.

11. The method of producing an aluminum nitride sintered compact according to claim 5, wherein the sintering step comprises heating in an inert gas atmosphere of 1,400° C. or higher and 1,800° C. or lower for 24 hours or less.

12. The method of producing an aluminum nitride sintered compact according to claim 11, wherein the inert gas to be used in the sintering step is a nitrogen gas.

* * * * *